(12) United States Patent
Pietrantonio et al.

(10) Patent No.: US 9,420,724 B2
(45) Date of Patent: Aug. 16, 2016

(54) POWER CONVERTER ASSEMBLY

(71) Applicant: GE Aviation Systems LLC, Grand Rapids, MI (US)

(72) Inventors: Michael Pietrantonio, Winter Springs, FL (US); Michael Carl Ludwig, Margate, FL (US); Mohamed Aly Elsayed, Pompano Beach, FL (US)

(73) Assignee: GE AVIATION SYSTEMS LLC, Grand Rapids, MI (US)

( * ) Notice: Subject to any disclaimer, the term of this patent is extended or adjusted under 35 U.S.C. 154(b) by 0 days.

(21) Appl. No.: 14/532,880

(22) Filed: Nov. 4, 2014

(65) Prior Publication Data

US 2016/0128236 A1  May 5, 2016

(51) Int. Cl.
*H05K 7/20* (2006.01)
*H01L 23/473* (2006.01)

(52) U.S. Cl.
CPC .................. *H05K 7/20509* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467
USPC ........................ 361/676–678, 679.46–679.54, 361/688–723; 165/80.1–80.5, 104.33, 185; 174/15.1–15.3, 16.1–16.3, 547, 548; 257/712–722, E23.088; 24/453, 24/458–459; 454/184; 312/236
See application file for complete search history.

(56) References Cited

U.S. PATENT DOCUMENTS

| | | | |
|---|---|---|---|
| 3,867,643 A | 2/1975 | Baker et al. | |
| 7,298,618 B2 | 11/2007 | Campbell et al. | |
| 7,400,504 B2 | 7/2008 | Campbell et al. | |
| 8,212,541 B2 | 7/2012 | Perreault et al. | |
| 2002/0152406 A1* | 10/2002 | Watts, Jr. | G06F 1/203 713/300 |
| 2002/0199048 A1* | 12/2002 | Rabinovitz | G06F 1/181 710/100 |
| 2003/0085048 A1* | 5/2003 | Lindholm | H01H 85/47 174/17 VA |
| 2007/0165376 A1* | 7/2007 | Bones | H01L 25/162 361/688 |
| 2007/0253164 A1* | 11/2007 | Matsuo | H01L 23/473 361/699 |
| 2008/0049476 A1* | 2/2008 | Azuma | B60L 3/12 363/131 |
| 2008/0130223 A1* | 6/2008 | Nakamura | H02M 7/003 361/689 |
| 2008/0266812 A1* | 10/2008 | Steger | H01L 24/72 361/721 |
| 2009/0040724 A1* | 2/2009 | Nishikimi | H05K 7/20927 361/699 |
| 2009/0201640 A1* | 8/2009 | Bard | H05K 7/20181 361/694 |
| 2009/0231811 A1* | 9/2009 | Tokuyama | H01L 23/36 361/699 |
| 2010/0079956 A1* | 4/2010 | Ibori | H02M 7/003 361/703 |
| 2010/0097765 A1* | 4/2010 | Suzuki | B60K 6/365 361/699 |
| 2010/0208427 A1* | 8/2010 | Horiuchi | H05K 7/20927 361/699 |
| 2010/0321889 A1* | 12/2010 | Yoshino | H05K 7/20927 361/702 |

(Continued)

*Primary Examiner* — Anthony Haughton
*Assistant Examiner* — Razmeen Gafur
(74) *Attorney, Agent, or Firm* — GE Global Patent Operation; William S. Munnerlyn

(57) ABSTRACT

A power converter assembly includes a housing, a cold plate located within the housing, a power converter module coupled with the cold plate, receiving a power input and providing a power output, and a thermal composite overlying the power converter module and at least partially thermally insulating the power converter module.

13 Claims, 12 Drawing Sheets

(56) References Cited

U.S. PATENT DOCUMENTS

| | | | | |
|---|---|---|---|---|
| 2011/0051371 A1* | 3/2011 | Azuma | ................ | B60K 6/445 361/699 |
| 2011/0069455 A1* | 3/2011 | Tokuyama | ............ | H01L 23/473 361/702 |
| 2011/0188204 A1* | 8/2011 | Horiuchi | ............... | H01L 23/473 361/702 |
| 2011/0222244 A1* | 9/2011 | Takashiro | ............. | H02M 7/003 361/704 |
| 2011/0286185 A1* | 11/2011 | Abe | ...................... | H05K 7/209 361/710 |
| 2012/0026691 A1* | 2/2012 | Campbell | .......... | H05K 7/20781 361/700 |
| 2012/0087095 A1* | 4/2012 | Tokuyama | ............. | B60K 6/365 361/721 |
| 2012/0162912 A1* | 6/2012 | Kim | ................... | H05K 7/20909 361/692 |
| 2012/0175981 A1* | 7/2012 | Enami | ............... | H02K 11/0073 310/72 |
| 2012/0188712 A1* | 7/2012 | Ishibashi | ............... | H02M 7/003 361/688 |

\* cited by examiner

POWER CONVERTER ASSEMBLY

STATEMENT REGARDING FEDERALLY SPONSORED RESEARCH OR DEVELOPMENT

This invention was made with government support under Contract No. SPM4A1-09-G-0003/BR03 awarded by the United States Army. The Government has certain rights in this invention.

BACKGROUND OF THE INVENTION

Power converters are utilized to convert electrical energy from one form to another, such as converting between AC and DC, or modifying any combination of voltage, current, and/or frequency from an input power to a resulting output power. Higher-power converters may include components capable of dealing with higher temperature operation due to, for example, high voltage and/or high current thermal losses.

BRIEF DESCRIPTION OF THE INVENTION

In one embodiment, a power converter assembly includes a housing, a cold plate located within the housing, a power converter module conductively coupled with the cold plate, receiving a power input, and providing a power output, heat-sensitive circuitry located within the housing and having a predetermined thermal operating limit, and a thermal composite overlying the power converter module and at least partially thermally insulating the power converter module from the heat sensitive circuitry. The power converter module generates heat while converting the power input to the power output, the thermal composite insulates the heat-sensitive circuitry from at least a portion of the generated heat such that the temperature of the heat-sensitive circuitry does not rise above the thermal operating limit, and at least a portion of the generated heat is removed by way of conduction through the cold plate.

DESCRIPTION OF EMBODIMENTS OF THE INVENTION

Embodiments of the invention may be implemented in any environment utilizing a power converter to convert power from one form to another. Non-limiting examples of power converter utilization may include stepping up or stepping down voltage signals, increasing or decreasing current, converting AC power to DC power, or vice versa. Non-limiting examples of environments utilizing the power converter apparatus may include mobile or fixed structures, mobile vehicles including any land, sea, or air-based vehicles.

Figure 1:
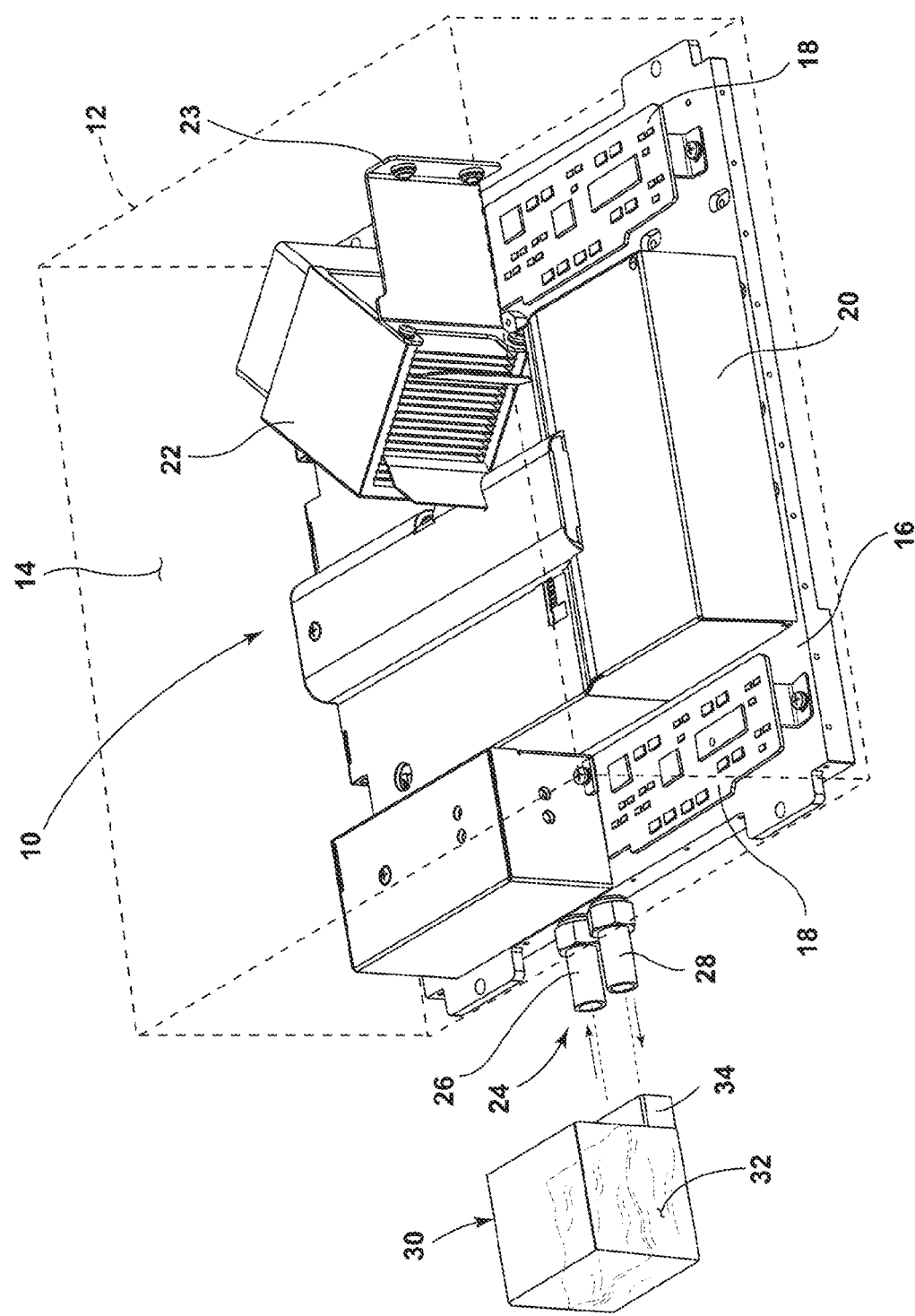
FIG. 1 is a perspective view of a power converter assembly in accordance with one embodiment of the invention.

FIG. 1 illustrates a power converter assembly 10 enclosed within a housing 12 (shown as a dotted box) such that the assembly 10 is included within the cavity 14 defined by the housing 12. The power converter assembly 10 may include several thermal regulating devices such as primary cold plate 16, thermal composite 20, and heat exchanger assembly 22. The heat exchanger 22 may further include a mounting bracket 23 for, in one example, mounting the heat exchanger 22 with the housing 12. Any suitable mechanical coupling, such as mechanical fasteners, bolts, nails, pins, etc., as well as non-mechanical fasteners, such as welding or adhesives, may be used to mount the exchanger 22 with the housing 12.

The cold plate 16 may define a portion of the housing 12, such as a bottom planar wall, and may further include a fluid connection port 24 having an inlet port 26 and an outlet port 28 and extending through the housing 12, external to the cavity 14, to provide an external coupling for, respectively, receiving and returning fluid delivered to the cold plate 16.

The power converter assembly 10 may additionally include a coolant reservoir 30, illustrated as a schematic box having coolant 32 coupled with the fluid connection port 24 and configured to, respectively, deliver coolant 32 to the inlet port 26, and receive the returned coolant 32 from the outlet port 28. In one example, the coolant reservoir 30 may be configured having a coolant pump 34 integrated with the reservoir 30 that may be capable of delivering 2.4 to 3.2 gallons per minute (gpm) of coolant to the power converter assembly 10. One non-limiting example of a suitable coolant may include a glycol fluid mixture. Embodiments of the invention may further include a coolant reservoir 30 configured with integrated or external mechanisms to cool and/or maintain the temperature of the coolant below a predetermined value, which can be a function of the specific environment for the power converter assembly 10 and/or specific characteristics of the power converter assembly 10. An illustrative predetermined value for a contemplated environment is 71 degrees Celsius, however alternative environmental temperatures, or temperature range for designated operations, may be included. Additionally, while liquid coolant 32 is illustrated, alternative coolant fluids, such as gases, may be included. Particular compositions of coolant 32 fluids are not germane to embodiments of the invention.

In the contemplated environment where heat removal is important, the housing 12 may be constructed from a thermally conductive material, such as aluminum, and may include additional housing elements configured for heat management considerations, for example pin fins. The housing 12 may further be exposed to one or more additional cooling mediums, such as ambient air or forced convection air delivered to the outer surface of the housing, if needed for heat management considerations. In one example configuration, the power converter assembly 10 and housing 12 may include a volume defined by 12 inches (width) by 12 inches (length) by 6 inches (height). Additional configurations may be included having alternative measurements and a total volume less than 1000 cubic inches.

Figure 2:
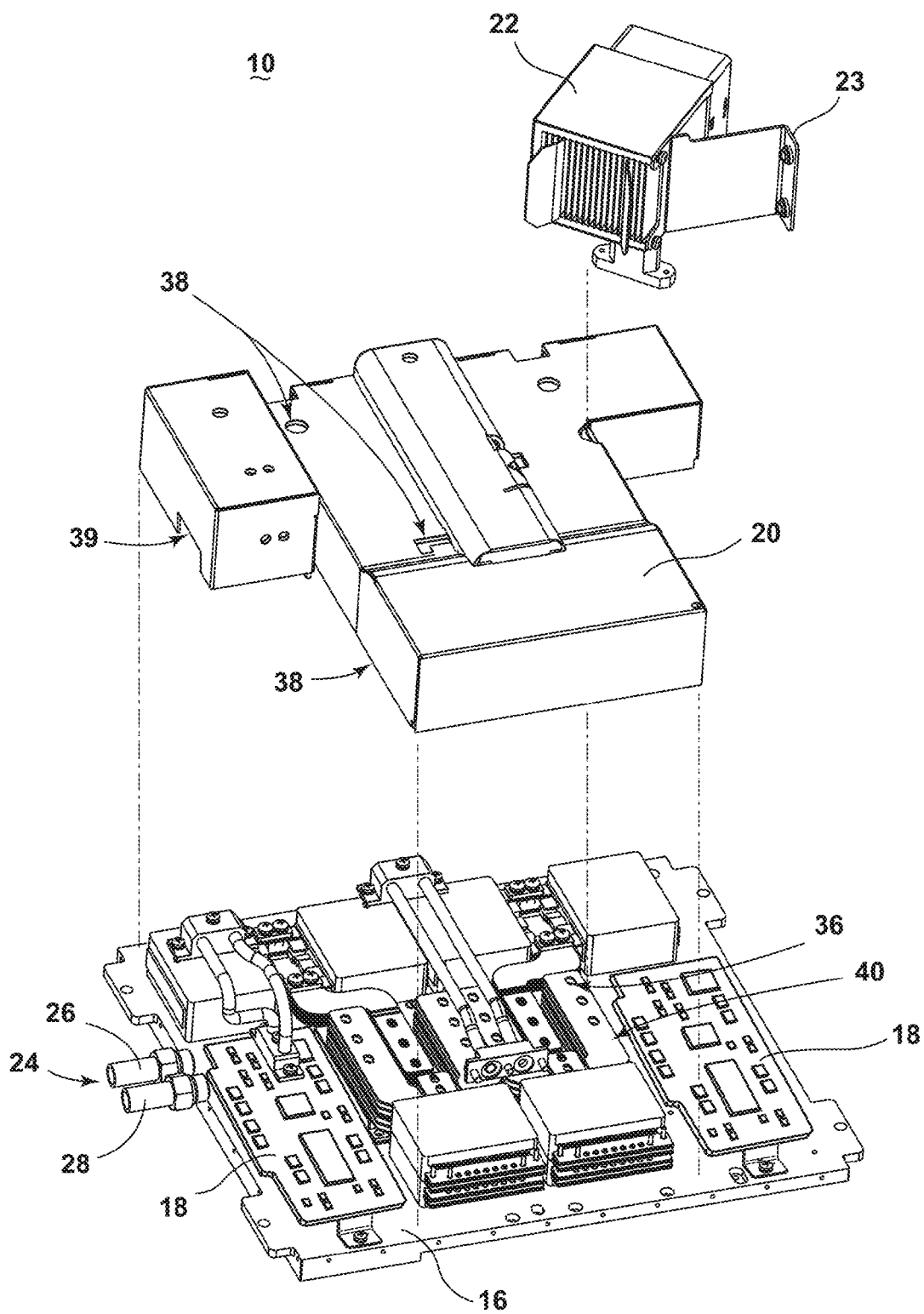
FIG. 2 is an exploded perspective view of the power converter assembly of FIG. 1, showing a heat exchanger assembly, and a thermal composite.

FIG. 2 illustrates an exploded perspective view of the power converter assembly 10 with the thermal composite 20 and heat exchanger 22 exploded away from the cold plate 16 to better illustrate heat generating components 36, such as power converter 40, for example, and heat sensitive circuitry, such a driver circuitry 18, which may drive the power converter assembly 10. The thermal composite 20 functions to insulate the heat generating components 36 from the heat sensitive circuitry 18. As shown, the thermal composite 20 is configured and/or shaped to further the components 36 within a space defined by the composite 20 walls and, for example, the cold plate 16. Embodiments of the invention may include configurations wherein the components 36 are not completely enclosed within a space defined by the composite 20 walls and the cold plate 16. For example, as shown, the composite 20 may include one or more access openings 38 to provide for connections to components underneath the thermal composite 20.

Additionally, embodiments of the invention may include configurations wherein at least one of the composite 20 wall edges and/or the cold plate 16 may be configured to account for the geometry of specific components 36 positioned directly between the composite 20 and plate 16 such that the composite 20 substantially encloses a majority, but not all, or only a portion of all of the components 36. Alternatively, embodiments of the invention may include configurations wherein at least one of the composite 20 wall edges and/or the cold plate 16 may be configured and/or keyed to correspond with the opposing composite 20 or cold plate 16 configurations. For example, at least one composite 20 wall edge is illustrated having a cutout 39 configured to match the fluid connection port 24 of the cold plate 16. Additional configurations and/or cutouts may be included.

Embodiments of the invention may include configurations wherein at least one of the plurality of components 36 may include a heat-producing electrical component 40 or circuitry, while one or more other electronics may be considered "heat-sensitive" circuitry. In general, "heat-sensitive" circuitry may operate under limited temperature ratings, and may malfunction or fail if the circuitry temperature or ambient temperature rises above a thermal limit value. In one such example, a thermal limit value of the driving circuitry board may be 105 degrees Celsius. In embodiments of the invention wherein the at least one heat-producing component 40 generates sufficient heat to rise the temperature above the thermal limit value, the thermal composite 38 may be configured to enclose at least a portion of the heat-producing component 40 in order to thermally isolate and/or insulate the heat-producing component 40 from the heat-sensitive board 18. However, those skilled in the art may understand the viability of heat-sensitive circuitry located proximate to heat-producing components is a relative standard, which may be affected by thermal management concerns, thermal configurations, heat removal capabilities, and the design of the respective heat-sensitive and heat-producing components. The referenced temperature and/or temperature ranges are merely an example of thermal limits.

As used herein, any component that is capable of generating an amount of heat that may be detrimental to another component should the heat raise the temperature of the environment or the another component may be considered a heat-producing component. Likewise, any component that may be detrimentally affected by heat introduced into an environment may be considered heat-sensitive circuitry.

Figure 3:
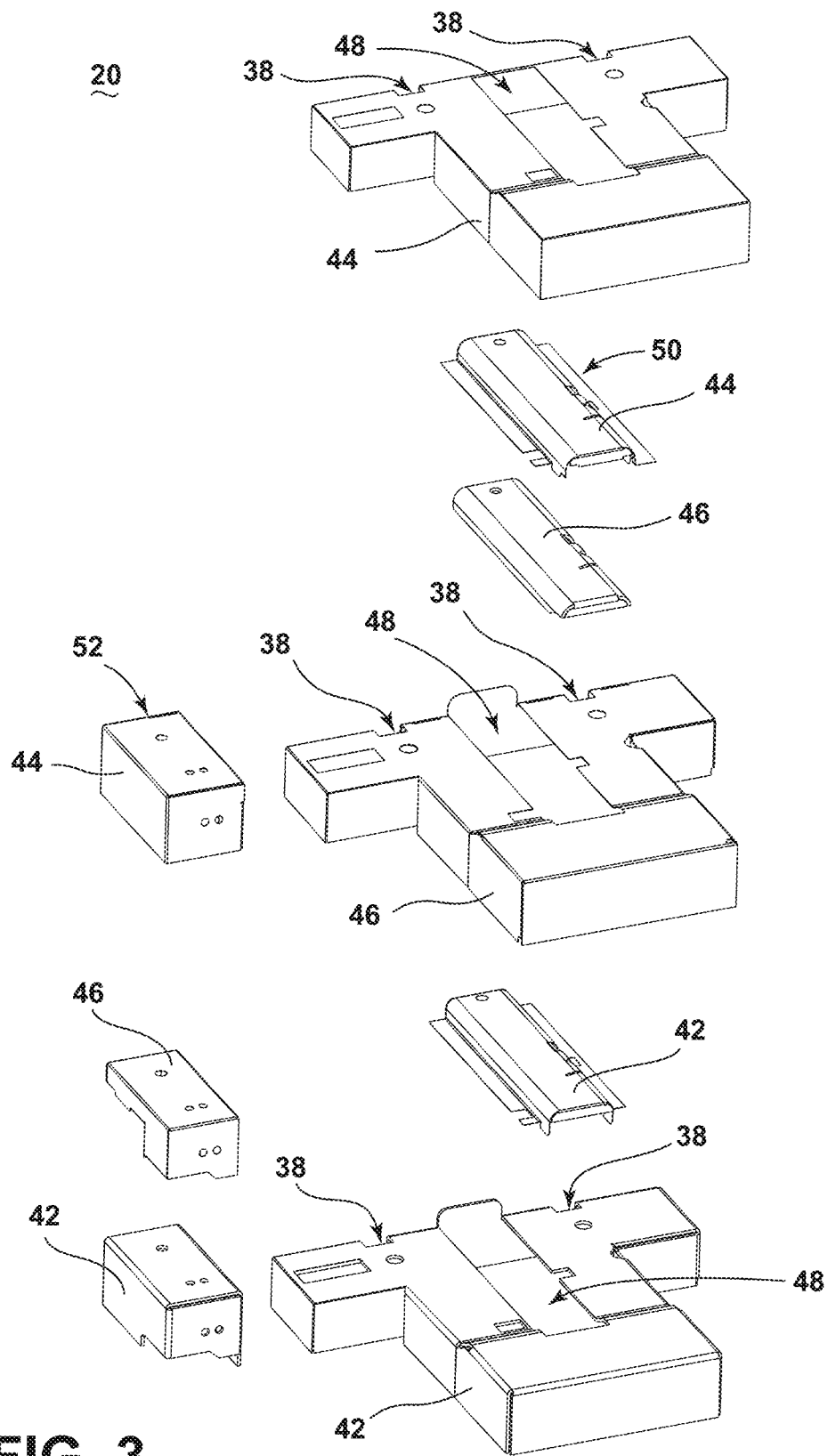
FIG. 3 is an exploded perspective view of the thermal composite of FIG. 2.

FIG. 3 illustrates an exploded view of the thermal composite 20. As shown, the thermal composite 20 may comprise at least a first rigid electrically insulating layer 42, a second rigid electrically insulating layer 44, and a third thermally insulating layer 46 positioned between the first and second layers 42, 44, which, when combined, forms a composite structure. In one non-limiting embodiment, at least one of the first and/or second layers 42, 44 may comprise Nomex material of 0.25 millimeters thickness, each. One embodiment may also include a third layer 46 comprising a poor thermal conductive material capable of tolerating high temperatures up to, for instance, 650 degrees Celsius, without any effects on the composition of the material. One non-limiting example of a third layer 46 material may include as Pyrogel, or Aerogel, with a thickness of 0.125 millimeters.

In the above-described thermal composite 20 example, the third layer 46 material may also include an embedded powder that increases the thermal insulating properties of the layer 46, such as silica. The assembling of the first, second, and third layers 42, 44, 46 may act to "sandwich" the third layer 46 having the powder, such that the powder does not readily escape from, or is retained by, the third layer 46 material. As described, the thermal composite 20 may be configured such that the composite 20 provides at least a minimum temperature gradient from the underside of the composite 20 to the topside of the composite 20 of 40 degrees Celsius. Alternative material compositions and/or thicknesses may be included to account for thermal considerations of the power converter assembly 10.

The thermal composite 20 may further comprise at least one thermally resistant fastener, such as thermally resistant tape, thermally resistant thread, or thermally resistant adhesive, which may secure at least two of the first, second, and/or third layers 42, 44, 46 together to for the unified composite layer 20. Non-limiting examples of the thermally resistant fastener may further include Kapton tape.

Also shown, the composite 20 may additionally comprise a number of subcomponents that may provide for specific structures or specific functionality, while still comprising the same layers 42, 44, 46 described above. For example, a large access opening 48 is shown as well as a first composite subcomponent 50 having a configuration corresponding to the large access opening 48, such that when assembled, the first composite subcomponent 50 may be removably coupled with the composite 20 for inspection and/or maintenance of the components 36 enclosed by the composite 20. Another second composite subcomponent 52 is also shown, which, for example, may be removably coupled with the composite 20 for inspection and/or maintenance of the fluid connection port 24. Embodiments of the invention may include a similar composite composition of the layers 42, 44, 46 described above. Each of the composite subcomponents 50, 52 may be coupled with the composite 20 by, for example, one or more thermally resistant fasteners, as described above. Alternatively, embodiments of the invention may include one or more configurations of the subcomponents wherein the composite subcomponents comprise dissimilar layers and/or thicknesses, for example, to account for thermal considerations of the whole or a portion of the corresponding power converter assembly 10.

The rigidity of at least one of the first and/or second layers 42, 44 may further be configured to define a self-supporting structural and/or geometric shell for the composite 20. Embodiments of the invention may include thermal composites 20 formed or assembled into particular geometric profiles to address large and/or small surface areas of any desired geometric shape. For example, when formed or assembled using the one or more thermally resistant fasteners, the first, second, or both layers 42, 44 may define a structural profile at least partially formed to correspond to the contours of a profile of the components 36, or the at least one heat-producing component 40. In another example, the first, second, or both layers 42, 44 may define a profile that is intentionally and at least partially spaced from the components 36 or at least one heat-producing component 40

When assembled, the composite 20 not only provides for thermal insulation, but also electrical insulation of the at least one heat-producing electrical component 40 from other components outside of the thermal composite 20, such as the heat-sensitive boards 18. Embodiments of the invention may further include composite 20 configurations that provide additional functionality, such as hydrophobicity. Additional embodiments of the invention may also include at least one additional electrically insulating layer and at least one additional thermally insulating layer, wherein each of the thermally insulating layers are alternately layered between the respective electrically insulating layers, and may be combined as a single thermal composite 20, to provide for specific electrical or thermal insulating properties and/or temperature gradients.

Figure 4:
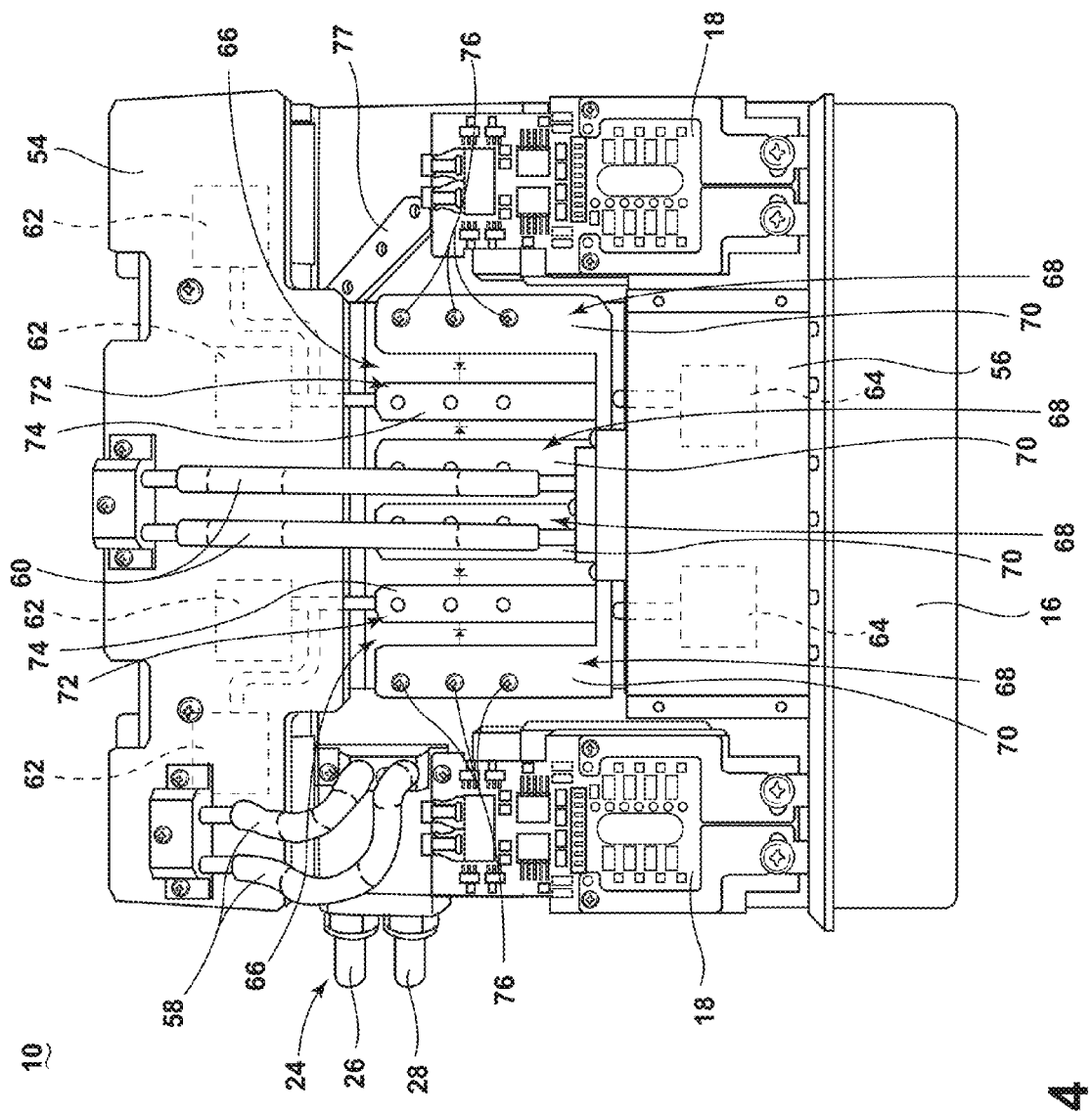
FIG. 4 is a top view of the power converter assembly of FIG. 2.

Turning now to FIG. 4, a top perspective view of the power converter assembly 10 is shown with both the thermal composite 20 and heat exchanger 22 removed to better illustrate various components. The assembly 10 may further comprise at least one additional secondary cold plate, or "daughter" cold plate, shown including a secondary cold plate 54 and a tertiary cold plate 56. Each of the secondary and tertiary cold plates 54, 56 may be directly or indirectly fluidly coupled with at least one of the primary cold plate 16 and/or the fluid inlet 26 and fluid outlet 28 of the fluid connection port 24. For example, as shown, the fluid connection port 24 may be fluidly coupled with the secondary cold plate 54 via a first flexible tubing set 58, and the secondary cold plate 54 may be further fluidly coupled with the tertiary cold plate 56 via a second flexible tubing set 60. One example of flexible tubing may include flexible stainless steel tubing. While flexible stainless steel tubing is described, embodiments of the invention may include non-flexible tubing, swage-type fittings, or tubing constructed from material other than stainless steel.

The power converter assembly 10 may further comprise at least one inductor 62 underlies the secondary cold plate 54, and is illustrated as four inductors 62 in dotted line, and at least one transformer 64 underlies the tertiary cold plate 56, as is illustrated as two transformers 64, also in dotted line. While the inductors 62 and transformers 64 are illustrated in dotted line, it is understood the dotted lines are merely schematic representations of the aforementioned components, and the dotted lines may not accurately represent the profile, size, shape, and/or configuration of each respective component described. Each of the inductors 62 and transformers 64 may be configured for use in high power applications, and may be collectively referred to as "power magnetics devices." In one example embodiment, one or more transformers 64 may include a high-frequency switch mode transformer, which for example, may be driven by a respective one or more of the driving circuitry boards 18.

The power converter assembly 10 may also comprise at least one power converter module 66, illustrated as two power converter modules 66. Each power converter module 66 includes at least one anode terminal 68 electrically coupled to at least one of the transformers 64 by an anode bus bar 70, and at least one cathode terminal 72 electrically coupled to at least one inductor 62 by a cathode bus bar 74. The anode 68 and cathode 72 may be electrically coupled with each respective bus bar 70, 74 by at least one of a mechanical or non-mechanical fastener. As shown, the anode 68 and cathode 72 may be fastened using a mechanical fastener, such as a screw 76. The top perspective view further illustrates a coupling location 77 for the heat exchanger 22

Figure 5:
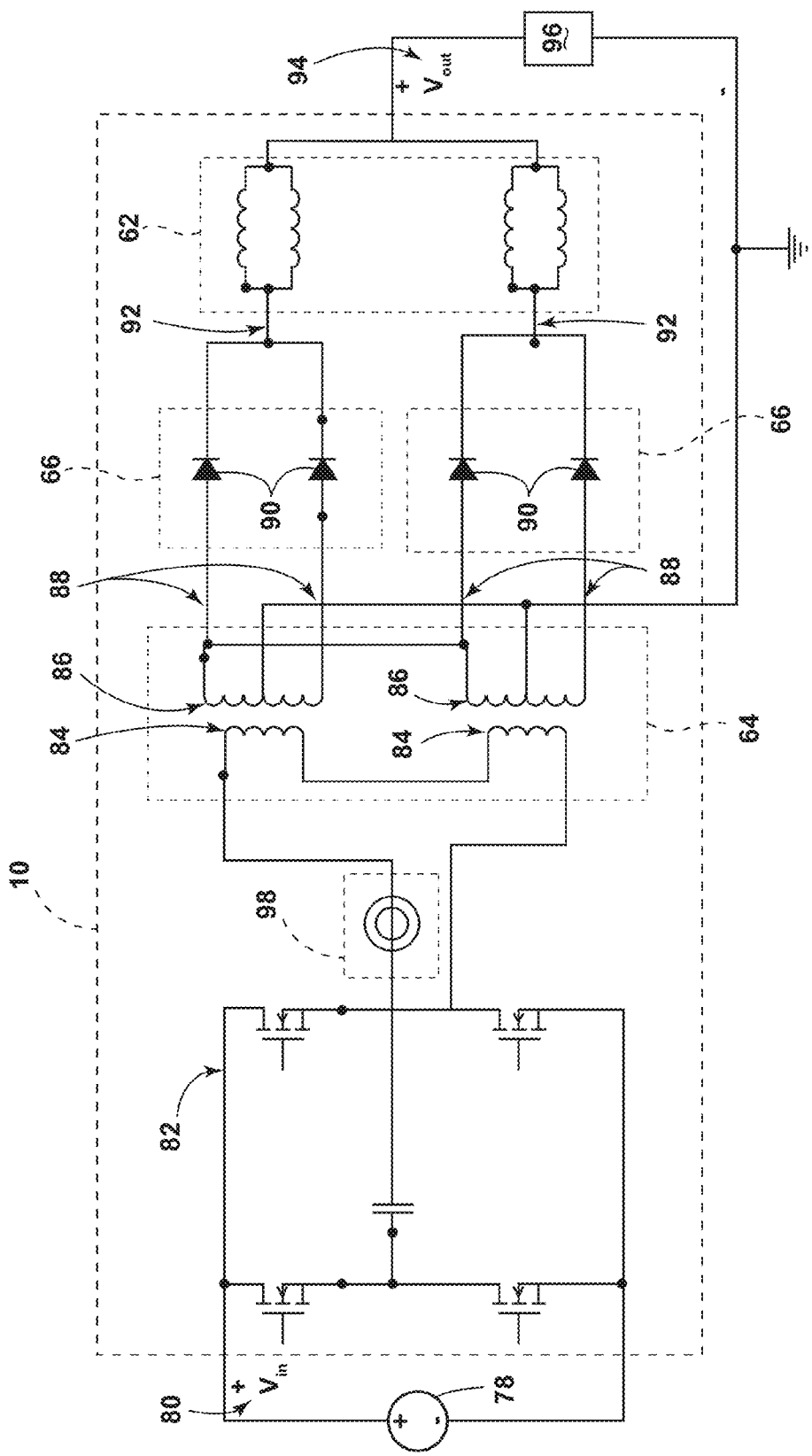
FIG. 5 is an electrical schematic view of the power converter assembly of FIGS. 1-4.

An example electrical schematic of the power converter assembly 10 of FIG. 4 is illustrated in FIG. 5. As shown, an external, high voltage and/or high capacity power source 78 such as a battery bank or generator may generate and supply a predetermined power amount, shown as a voltage input 80 to a bank of high-frequency switching circuits, for example high power half-bridge modules 82, such as MOSFET half-bridge modules. The half-bridge modules 82 may be, for example, driven by the one or more driving circuitry boards 18. In one example configuration, the power source 78 may provide and/or supply 600 Volts of direct current (VDC) at 27 amperes (amps), or 16.2 Kilowatts (KW). While one non-limiting example of a power supplied by the power source 78 is described, embodiments of the invention may be configured to receive alternative power supply characteristics, for example, at least 550 VDC, or at least 15 KW.

In one example embodiment, the half-bridge modules 82, driven by the driving circuitry boards 18, may perform high-frequency switching and power conversion functions, and may supply at least one output which is received by the one or more transformers 64. Each transformer 64 may operate to convert the voltage received from the half-bridge modules 82, supplied to the primary winding 84, to a different voltage supplied to the secondary winding 86. As shown, each secondary winding 86 may have multiple outputs 88. In one example, each transformer 64 converts a 600 VDC transformer input to a 28 VDC transformer output, at a much higher current, for example, approximately 578 amps, less any losses of the transformer 64. Each transformer output 88 is supplied to at least one power converter module 66, which is shown further comprising at least one diode 90 or diode bank corresponding to each output 88, or two diodes 90 per module 66.

Each power converter module 66 operates to convert the transformer output 88, or received current and voltage, to a module output 92 current and voltage, via the respective diodes 90. Each module output 92 if then supplied to the at least one inductor 62, which may, for example, be configured to reduce any output-voltage ripple generated by the components of the power converter assembly 10. The power output of the at least one inductor is finally provided as a power converter assembly output, shown as a voltage out 94, and supplied to at least one electrical load 96. While an electrical load 96 is described, alternative destinations for the power output 94 may be included, such as a capacitor bank.

The power converter assembly 10 may include additional optional components, such as a current sensor 98, a voltage sensor, one or more output capacitors, capacitor banks, or power bus bars, and may be configured with more or fewer half-bridge modules 82, transformers 64, diodes 90, power converter modules 66, and/or inductors 62. Collectively, the power converter assembly 10 may be configured to covert the power supplied by the power source 78 to a power output 94 of at least 15 KW, 28 VDC, and/or 535 amps or ampere loads. This non-limiting example of a power output 94 assumes an estimated 93% power efficiency of the converter assembly 10 as a whole, which may include power losses from at least one of the half-bridge modules 82, transformer 64, diodes 90, power converter modules 66, and/or inductors 62, which may include thermal losses from heat generation from one or more of the aforementioned components. Additional configurations of the power converter assembly and/or one or more power converter modules 66 may operate to convert a same or different input power to an output power 94 of at least 10 KW, and/or 500 amps or ampere loads, at a similar or dissimilar power efficiency levels. Furthermore, while a DC power supply 78 is described, embodiments of the invention may be configured such that the power converter modules 66 and/or diodes 90 may be configured to provide for, for example, half-wave or full-wave rectification, and thus provide alternating current (AC) to DC power conversion instead of, or in addition to the aforementioned power conversions.

Figure 6:
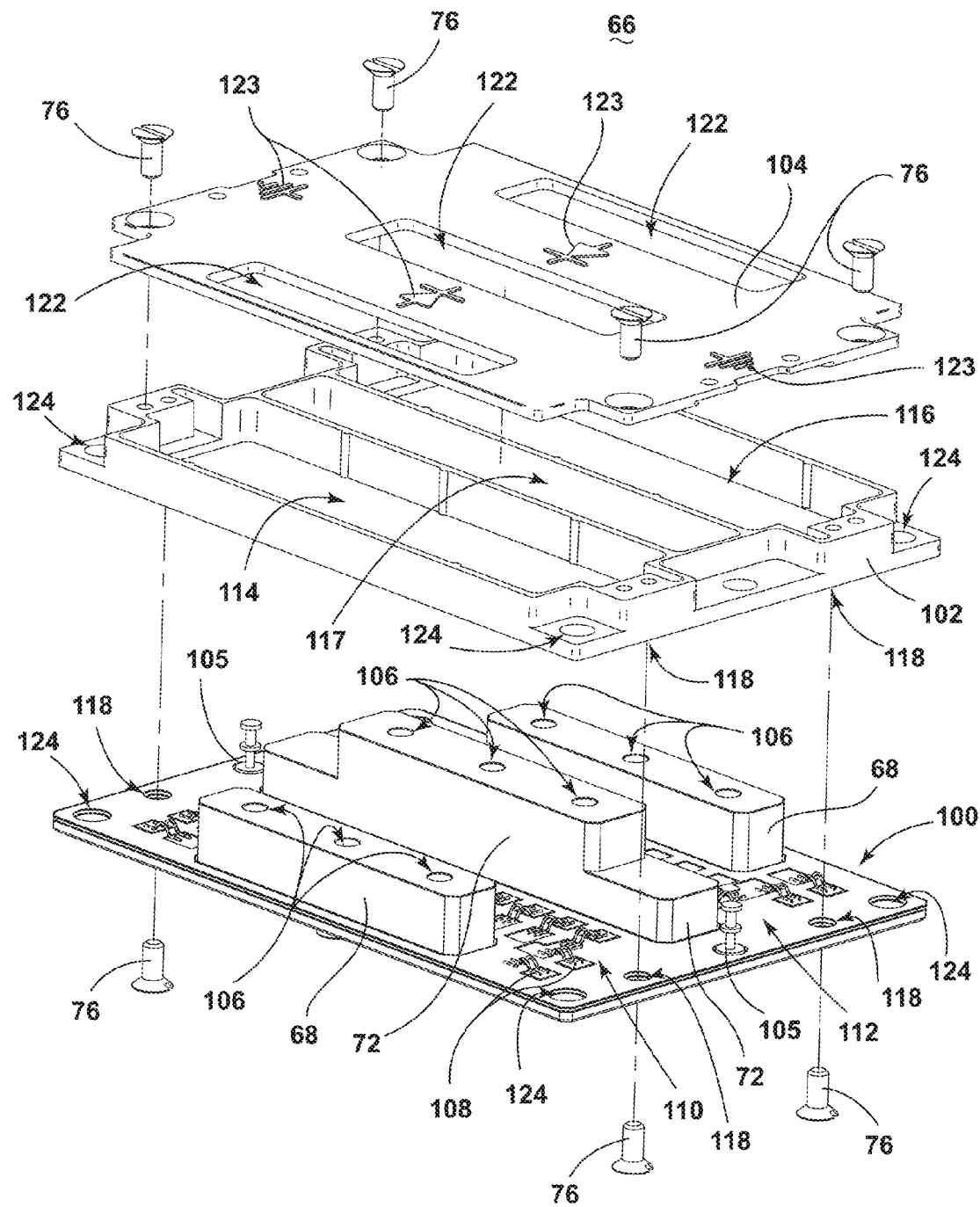
FIG. 6 is an exploded perspective view of a power converter module of FIG. 4.

FIG. 6 illustrates one embodiment of a power converter module 66 in further detail. As shown, each power converter module 66 may further include a circuit board 100 having the at least one anode terminal 68 and the at least one cathode terminal 72, a module potting frame 102 overlying the circuit board 100, and a module cover 104 which may overlie at least one of the potting frame 102 and circuit board 100. The circuit board 100 may also include at least one ground connection 105 for grounding the power converter module 66 to a common electrical ground, such as the primary cold plate 16.

As shown, each of the anode and cathode terminals 68, 72 may be elongated along a length of the circuit board 100 and may extend normally upwards, away from the board 100. The illustrated embodiment shows one example configuration wherein there are two anode terminals 68 spaced from each other by a cathode terminal 72 common to each anode terminal 68, although alternatively configured embodiments, such as a one-to-one ratio, or a multi-to-one ratio of anode terminals 68 to cathode terminals 72, may be include. Additionally, while the height of the cathode terminal 72 extending normally away from the circuit board 100 is shown greater than the height of the anode terminal 68, the relative heights are not critical and alternative configurations may be included. As shown, each of the anode terminals 68 and cathode terminals may further include fastener openings 106 configured to correspond with the fasteners or screws 76 coupling the bus bars 70, 74 to the respective anode and cathode terminals 68, 74.

The circuit board 100 may further include a number of diodes 108 electrically arranged in parallel and provided in a gap between an anode terminal 68 and cathode terminal 72, and configured to provide a forward bias from the anode 68 to cathode 72. In the configuration illustrated, a single power converter module 66 may include a first plurality of diodes 110 and second plurality of diodes 112 electrically arranged, respectively, in parallel between a first anode 68 and common cathode 72, and a second anode 68 and common cathode 72. In this sense, the common cathode 72 may provide a common output from the power supplied to each of the anodes 68 and delivered via each of the pluralities of diodes 110, 112. Utilizing this configuration, a single power converter module 66 may be capable of full-wave rectification of a varying power signal, such as a first AC power signal and a second AC power signal out of phase from the first, delivered to the respective anode terminals 68. In the non-limiting illustrated example, the power converter module may fit in a volume defined by 4.05 inches long (e.g. along the elongated terminal 68, 72 direction), 2.7 inches wide, and 0.61 inches tall (e.g. from the bottom of the circuit board 100 to the tallest terminal 68, 72).

In another embodiment, the illustrated power converter module 66 may provide half-wave rectification of a common varying power signal delivered to each anode terminal 68. Additionally, while the illustrated example embodiment is shown having two anode terminals 68 and a common cathode terminal 72, embodiments of the invention may include a single anode terminal 68 electrically coupled with a single cathode terminal 72 via a single plurality of diodes 110, to effect, for example, half-wave rectification. This alternative embodiment described may, for instance, have a smaller footprint and/or volume than the embodiment illustrated, such as 4.05 inches long, by 1.60 inches wide, by 0.61 inches tall.

In one embodiment, the circuit board 100 may include silicon carbide (SiC) diodes 108, wherein each SiC diode 108 is configured with an open chip mount or configuration (i.e. without additional chip packaging) and capable of operating under at least 40 amp loads each without component failure, for example, due to thermal generation during operation. SiC diodes are merely provided as one example diode composition because of their ability to handle high voltage (e.g. 600V to 1200 V) and high current power (50 A to 1500 A, collectively) while avoiding detrimental peak transients and/or thermal failure due to transients and/or parasitics from the high frequency switching operations.

For example, using the example power characteristics described above, performing a 15 KW power conversion spread over two power converter modules, a plurality of fifteen diodes 108 distributed between a single anode terminal 68 and cathode terminal 72 may collectively generate at least 440 thermal Watts of heat, wherein a thermal Watt is defined as 3.413 British thermal units (BTU) per hour. Due to this heating constraint, each SiC diode 108 is spaced relative to each other on the circuit board such that the spacing prevents thermal failure of one or more diodes 108, and/or the power converter module 66 as a whole. In the illustrated example configuration, each SiC diode 108 may be spaced at least 3 millimeters apart from each other. In another embodiment of the invention, the spacing for thermal management concerns may include consideration of additional thermal management mitigation components, such as those that are included below.

The module potting frame 102 may include a number of openings corresponding to components of the circuit board 100. For example, a first and second opening 114, 116 may align with, correspond to, and/or be configured to allow the anode terminals 68 to extend through the respective opening 114, 116 when the module 66 is assembled. In another example, a third opening 117 may align with, correspond to, and/or be configured to allow only the cathode terminal 72 to extend though the opening 117 when the module is assembled. Alternative configurations for providing access to the anode and/or cathode terminals 68, 72 may be included. The potting frame 102 and circuit board 100 may each further include correspondingly aligned openings 118 for receiving a fastener, such as a screw 76. Alternative fasteners and corresponding fastener openings 118, or alternative methods of fastening may be included.

As shown, the first and/or second openings 114, 116 may further align with, correspond to, and/or be configured to provide access to a respective plurality of diodes 110, 112 when the potting frame 102 is coupled with the circuit board 100. In this sense, when the potting frame 102 is coupled with the circuit board, the potting frame 102 may define sidewalls 120 about at least a portion of the plurality of diodes 110, 112. The sidewalls 120 abutting the circuit board 100, when coupled, may further allow for inclusion of, for example, a dielectric layer, such as an epoxy, to be formed, spread, and/or otherwise fixed, such that the dielectric layer overlies the SiC diodes 108 and/or at least a portion of the circuit board, to reduce the chance and/or risk of electrical short between aforementioned components.

The module cover 104 may include openings 122 corresponding with each of the potting frame openings 114, 116, 117, and/or just provide an opening 122 configured to allow the respective anode and/or cathode terminals 68, 72 to extend through when the module 66 is assembled. The cover 104 may also include indicia 123 such as a ground symbol near a ground connection 105 or a diode symbol indicating the forward bias between the respective anode and cathode terminal 68, 72, in order to improve the ease of assembly and/or maintenance of the power converter module 66.

Each of the module cover 104 and the potting frame 102 may also include correspondingly aligned fastener openings 118 for receiving a fastener, such as a screw 76, for coupling the potting frame 102 with the cover 104. Alternative embodiments of the invention may include, for example, a common fastener opening between each of the cover 104, potting frame 102, and circuit board 100, such that a single fastener, such as a non-conductive screw 76 may secure and/or couple the power converter module 66 together. At least one of the cover 104, potting frame 102, and circuit board 100 may further include an additional fastener opening, illustrated as correspondingly aligned openings 124 in each of the potting frame 102 and circuit board 100, for receiving a fastener that may couple and/or secure the power converter module to the primary cold plate 16.

Figure 7:
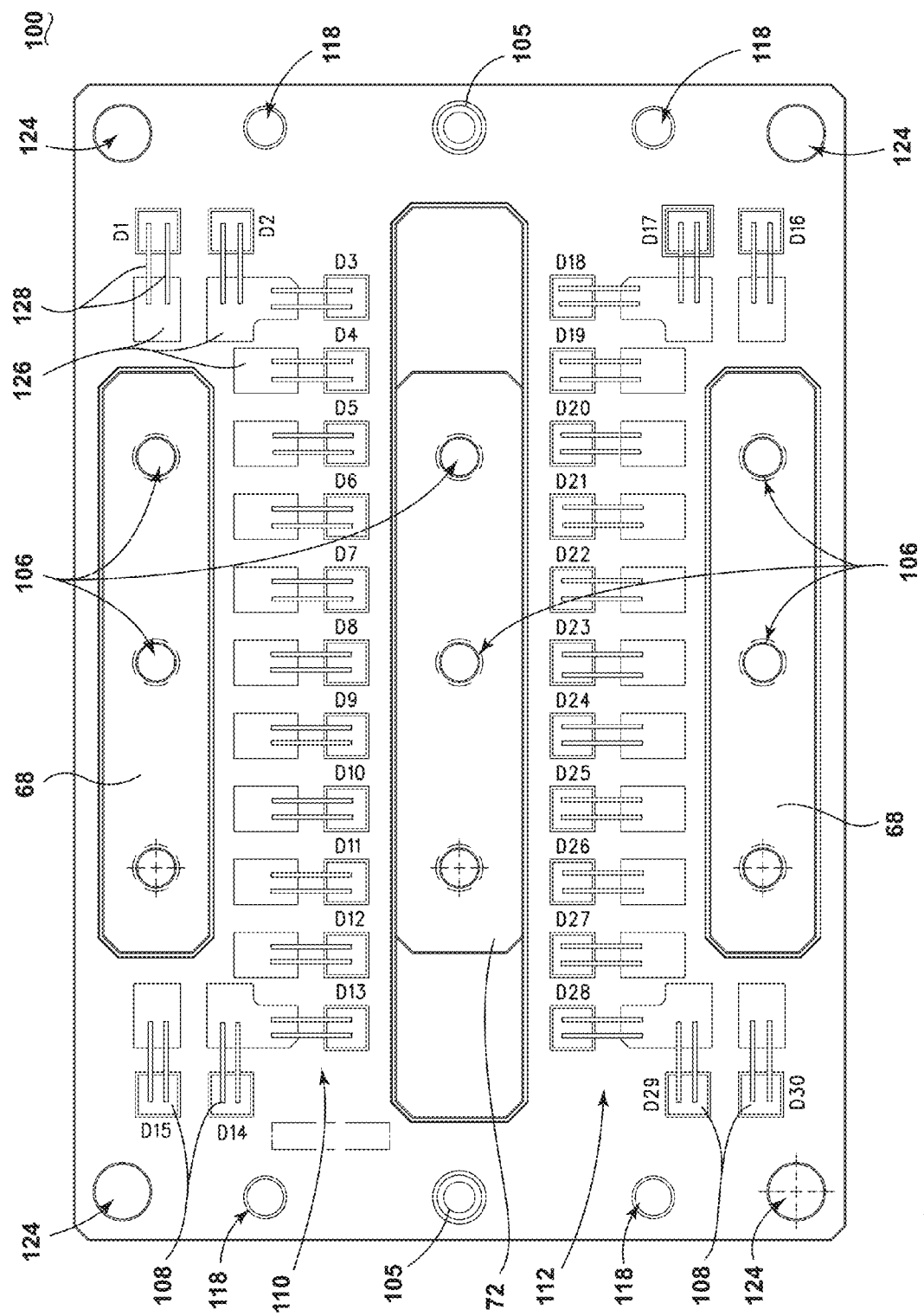
FIG. 7 is a top view of the power converter with a module potting frame and cover removed for clarity.

FIG. 7 illustrates a top view of the circuit board 100 of FIG. 6, showing a detailed view of the layout of the terminals 68, 72 and SiC diodes 108 arranged in parallel between each anode and cathode terminal 68, 72, as well as the spacing of the diodes 108. While the illustrated embodiment is shown having fifteen SiC diodes 108 for each anode-cathode connection, additional configurations may be included having more or fewer diodes 108, and/or alternative spacing of the diodes 108, to account for at least one of power requirements of the module 66 and/or thermal considerations of the components. The circuit board 100 may further include a plurality of conductive regions 126 corresponding with each SiC diode 108 and electrical coupled with each respective anode terminal 68, and wire bonding 128 electrically coupling the conductive region 126 to the respective SiC diode 108.

Figure 8:
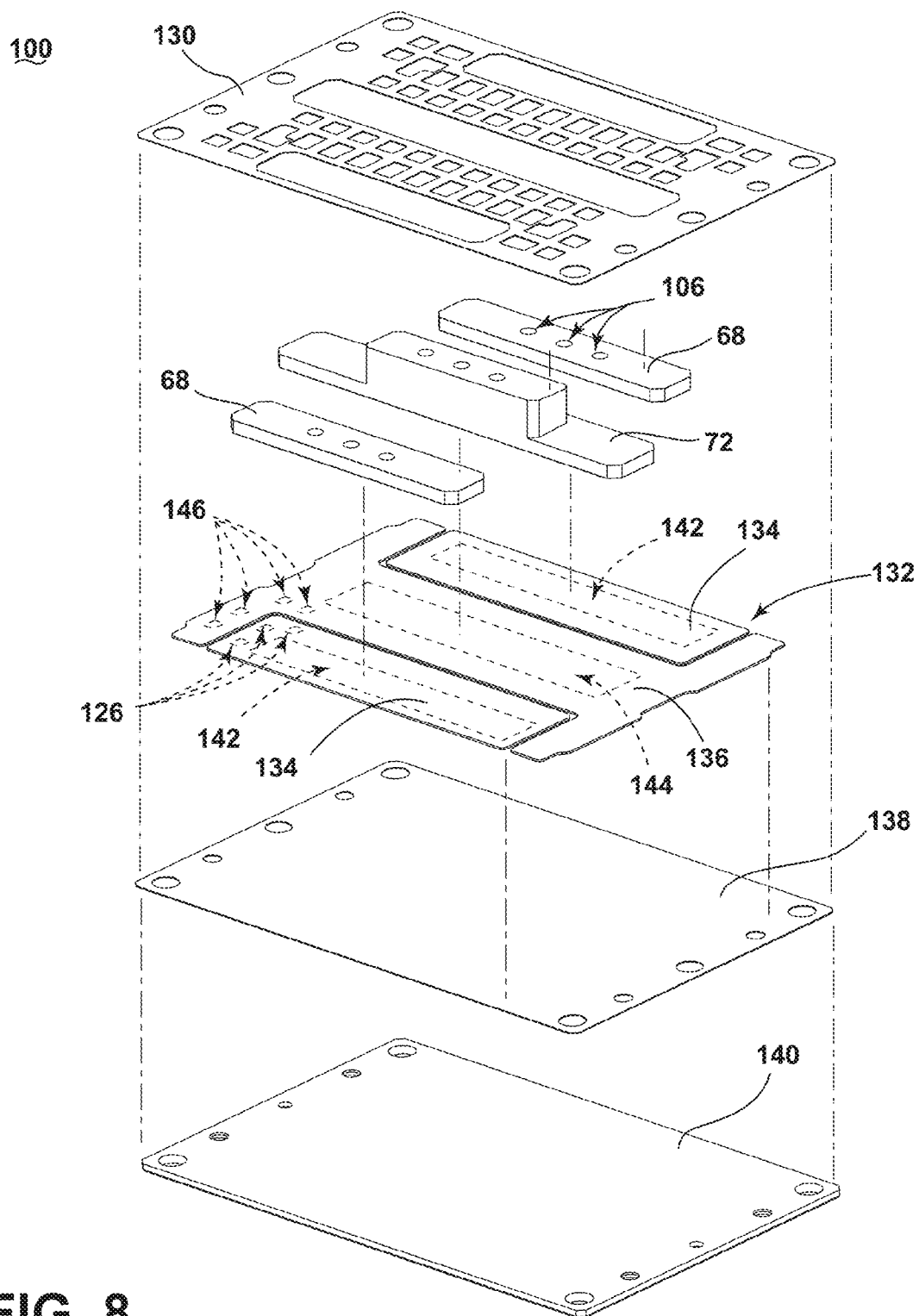
FIG. 8 is an exploded view of a circuit board for the power converter module of FIG. 7.

Turning now to FIG. 8, an exploded perspective view illustrates the multiple layers of the circuit board 100, wherein the diodes 108 have been removed for clarity. In addition to the previously described terminals 68, 72, the circuit board 100 may include a circuit mask layer 130 for positioning electrical components such as the diodes 108, terminals 68, 72, and exposing portions of the conductive regions 126, an electrically conductive layer 132 having at least an anode conductive portion 134 and an electrically isolated cathode conductive portion 136, a dielectric layer 138 such as a dielectric film, and a thermally conductive substrate layer 140 isolated from the electrically conductive layer 132 by the dielectric layer 138. The thermally conductive substrate layer 140 may comprise any high thermal conduction material, such as copper. Additional conductive substrate layers may be included.

As illustrated by dotted outline, the anode conductive portion 134 aligns with both the anode position 142 and the conductive region 126 defined by the circuit mask 130, such that the anode conductive portion 134 is electrically coupled with each of the conductive regions 126, and anode terminal 68. Additionally illustrated by dotted outline, the cathode conductive portion 136 aligns with the cathode position 144 and diode positions 146 defined by the circuit mask 130, such that the cathode conductive portion 136 is electrically coupled with each of the cathode terminal 72 and diodes 108.

When assembled and operating, each power converter module 66 provides a high current (e.g. greater than 50 amp) power converter. During high current operation, each of the SiC diodes 108 may experience power loses through thermal heating, as described above. The thermally conductive substrate layer 140 of the circuit board 100 provides a thermally conductive pathway for conductive heat transfer down and away from at least a portion of the diodes, where the heat may be further removed from the conductive substrate 140 via, for example a thermally conductive relationship with the primary cold plate 16, as described herein. Embodiments of the invention may include configurations wherein only a portion of the heat generated by the diodes 108 may be removed by way of the conductive substrate 140, while the remaining heat may be removed through a combination of convection and radiation. In one example, wherein a plurality of diodes 110, 112 collectively generates at least 440 thermal Watts of heat, 343 thermal Watts of heat may be removed via the cold plate 16 and/or conductive substrate layer 140.

Figure 9:
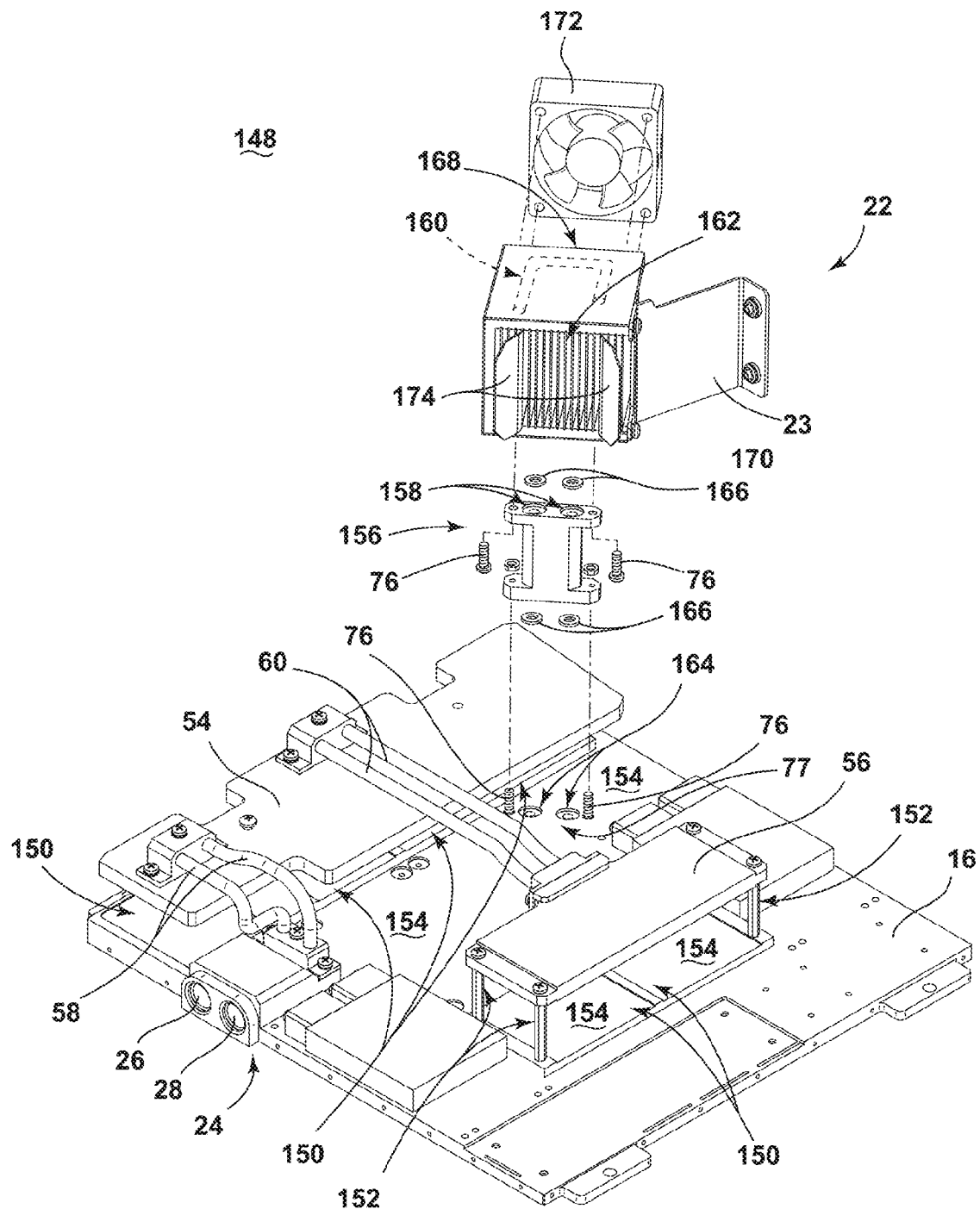
FIG. 9 is an exploded perspective view of the heat exchanger assembly of FIG. 1.

FIG. 9 illustrates a portion of the power converter assembly 10 including only the components utilized for heat removal, cooling, and/or heat exchanging. As shown, a heat exchanger assembly 148 includes the heat exchanger 22, the primary cold plate 16, the secondary cold plate 54, and the tertiary cold plate 56. Each of the cold plates 16, 54, 56 may be formed, molded, or machined from a highly thermally conductive material suitable for transference of heat via direct or indirect conduction with at least one heat-generating component. One example of a cold plate 16, 54, 56 composition may include copper, but alternative compositions may be included. Each of the secondary and tertiary cold plates 54, 56 may be supported by and coupled with the primary cold plate 16 via one or more fasteners, such as screws 152.

As previously described, the secondary cold plate 54 may be fluidly coupled with at least one of the primary cold plate 16 and/or the fluid connection port 24 such that coolant 32 pumped from the coolant reserve 30 may be delivered to a coolant passage of the secondary plate 54 via at least one of the fluid connection port 24, a coolant passage of the primary cold plate 16, and/or the first tubing set 58. Similarly, the tertiary cold plate 56 may be fluidly coupled with the secondary cold plate 54 such that coolant 32 pumped from the coolant reserve 30 may be delivered to a coolant passage of the tertiary plate 56 via, for example, the second tubing set 60. While the terminology of a "passage" may be used herein, each "passage" of embodiments of the invention may include multiple passages or passageways, for example, an input and output passage, or a delivery and return passage, even though terminology may imply only a single passage or passageway.

While the illustrated embodiment describes at least a portion of a cooling circuit wherein coolant 32 may be delivered serially to the primary cold plate 16, followed by the secondary cold plate 54, followed by the tertiary cold plate 56, alternative configurations may be included, wherein, for example, coolant 32 is pumped in parallel to two or more components, such as the secondary and tertiary plates 54, 56 simultaneously. Additional coolant circuit configurations may include any combination of the aforementioned descriptions including any or all of the cold plates 16, 54, 56.

At least one of the cold plates 16, 54, 56 may further define at least one component seat 150 for receiving a heat-producing component. For example, as illustrated, the primary cold plate 16 includes a number of recessed component seats 150 for receiving heat-producing components including the power magnetic devices (e.g. the inductors 62 and transformers 64). Each component seat 150 may, for instance, provide a planar face 154 for thermally coupling the respective cold plate 16, 54, 56 to one or more respective heat-producing components. Additionally, embodiments of the invention may include an additional thermally conductive layer between one or more cold plate 16, 54, 56 and one or more heat-producing components, such as a thermal epoxy or thermally conductive film, for example, to increase the surface area of the thermal conduction, to increase conduction efficiency, or to maintain the thermal coupling.

The primary cold plate 16 may further include one or more component seats 150 for receiving each of the power converter modules 66. Embodiments of the invention may further include component seats 150 on at least one of the secondary or tertiary cold plates 54, 56, for example, corresponding with component seats 150 of the primary cold plate 16. In this sense, a corresponding pair of recessed component seats 150 between the primary and secondary cold plates 16, 54 may be utilized to receive, for example, a transformer 64, and secure the transformer 64 within the pair of component seats 150 when the tertiary cold plate 56 is fastened with the primary cold plate 16 via the screws 152. In this example, the screws may provide a compressive configuration to physically bias any two cold plates 16, 54, 56 towards each other about the heat-producing component, such that the physical biasing may further maintain the thermal coupling between the plates 16, 54, 56 and the heat-producing component.

The above-described embodiments may provide for a heat exchanger assembly 148 and/or cooling structure that includes at least two cold plate planar faces 154 configured to thermally couple with at least two corresponding planar faces of a heat-producing component, such as one or more power magnetics devices. In this sense, a first face of, for example, a transformer 64 may conductively couple with a planar face 154 of the primary cold plate 16 such that at least a portion of heat generated by the transformer 64 is removed by way of thermal conduction to the primary cold plate 16. Likewise, a second face of, for example, a transformer 64 may conductively couple with a planar face 154 of the tertiary cold plate 56 such that at least a different portion of heat generated by the transformer 64 is removed by way of thermal conduction to the tertiary cold plate 56. Each of the respective planar faces 154 of, for instance, the primary and secondary cold plates 16, 54 may remove heat from one or more inductors 62 via thermal conduction in a similar fashion. Furthermore, the thermal coupling of the power converter module 66 with the primary cold plate 16 may also remove heat from the module 66 and/or diodes 108 via thermal conduction.

While the cold plate faces 154 and the heat-producing components may be described having planar faces, embodiments of the invention may include heat-producing components having faces that are not planar, and wherein the corresponding cold plate faces 154 define a geometric profile to match the non-planar faces of the heat-producing components. Furthermore, while the corresponding faces 154 of the cold plates 16, 54, 56 may be applied to opposing faces of the heat-producing component, alternative embodiments of the invention may include applying cold plate faces 154 to non-opposing faces of the heat-producing components, wherein heat is removed via conduction from the non-opposing faces.

The heat exchanger 22 is shown further comprising a mounting bracket 156, a coolant passage of the heat exchanger 22 (schematically illustrated as dotted lines 160), and a plurality of thermally conductive fins 162. The mounting bracket 156 may further include at least one coolant passage 158 and may be configured to physically and fluidly couple the exchanger coolant passage 160 with a coolant passage 164 of the primary cold plate 16. The mounting component may also include a number of, for example, O-rings 166 to ensure a fluid-tight coupling. The heat exchanger 22 and/or mounting bracket 156 may be coupled together, or with the primary cold plate 16, by any of the aforementioned fastener means, such as screws 76.

The plurality of thermally conductive fins 162 may be thermally conductively coupled with the heat exchanger passageway 160 such that coolant delivered from the primary cold plate 16 (via the passage 164), through the mounting passage 158, and into the exchanger passage 160 may conductively remove heat from the fins 162. The plurality of fins 162 may be configured to align in parallel over an elongated length of the heat exchanger 22 and define a plurality of spaces (respectively between fins) such that air may fluidly pass from one end of the heat exchanger 22 (illustrated as an air input 168) to the opposing end of the length of the heat exchanger 22 (illustrated as an air output 170).

The heat exchanger assembly 148 may further include a fan 172 configured to mount to the heat exchanger 22 at the air input 168, and configured to effect a movement of ambient air into the air input 168, past the plurality of fins 162, and out of the air output 170. In this sense, the movement of air past the fins 162 conductively couple with the coolant passage 160 cools the air by forced convection, and thus, may remove at least a portion of heat from the moving air. Additionally, embodiments of the invention may include at least one fin (illustrated as two fins 174) shaped and/or physically oriented to direct, or redirect, at least a portion of air at the output 170 of the heat exchanger 22 toward different directions. For example, when assembled, the fins 174 may direct at least a portion of the cooled air towards or away from at least one of a heat-generating or heat-producing component, or heat-sensitive circuitry, as previously described. In this sense, the fins 174 may be utilized to provide targeted cooling for specific heat management needs or concerns.

Figure 10:
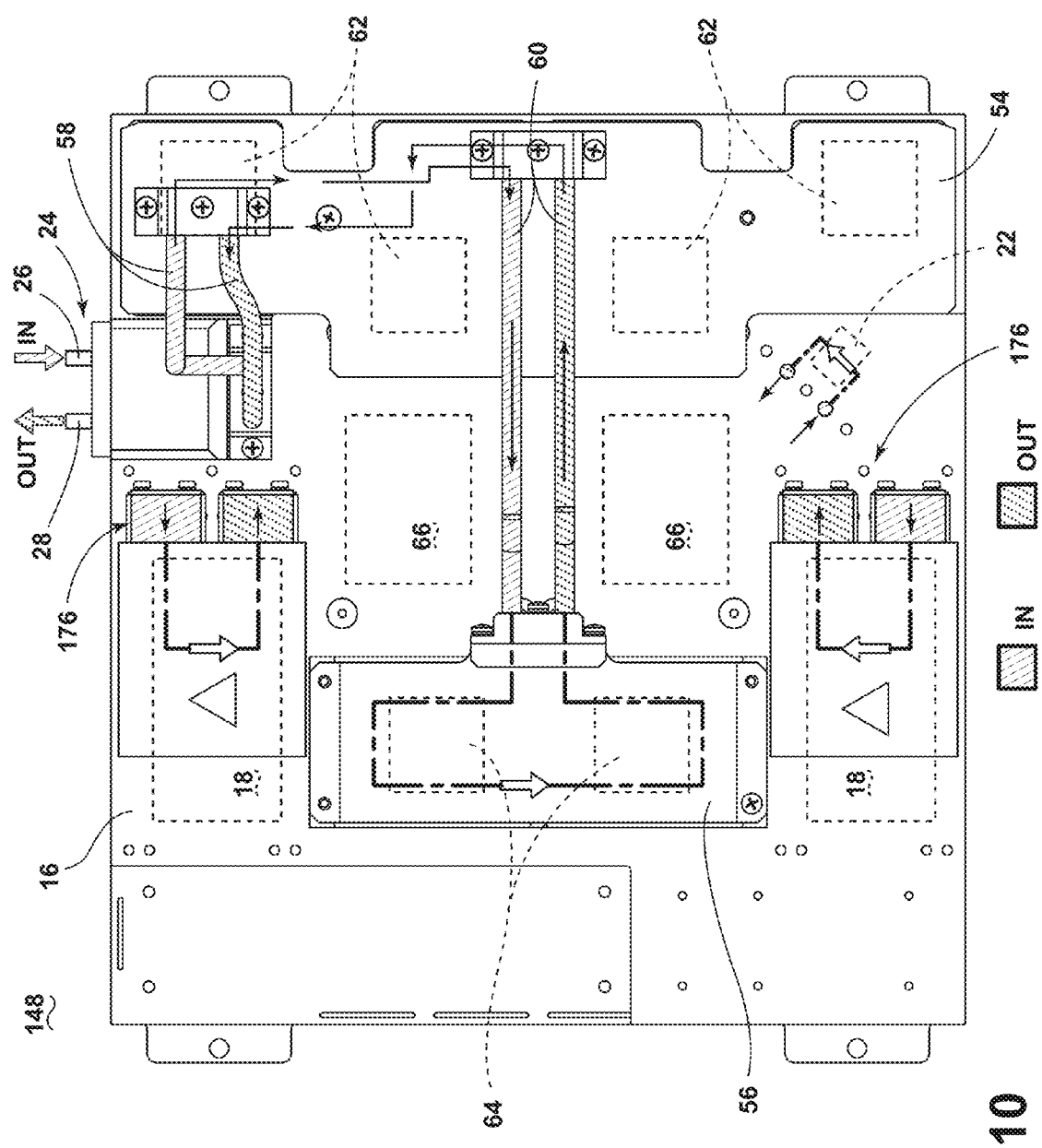
FIG. 10 is a top view of a partial schematic view of coolant flow paths through a portion of the heat exchanger assembly.

FIG. 10 illustrates a top schematic view of one embodiment of the heat exchanger assembly 148 coolant flow, with the direction of coolant flow generally indicated by arrows. Coolant may be delivered to the fluid connection port 24 via the inlet port 26. From the inlet port 26, the coolant may be delivered sequentially or in parallel to a number of cooling components including the primary cold plate 16 to at least partially remove heat from, for example, the inductors 62 (position illustrated by dotted outline), transformers 64 (position illustrated by dotted outline), and power converter modules 66 (position illustrated by dotted outline), the secondary cold plate 54 to at least partially remove heat from one or more inductors 62, the tertiary cold plate 56 to at least partially remove heat from one or more transformers 64, and the heat exchanger 22 (position illustrated by dotted outline) to at least partially remove heat from the ambient air, as described herein. Embodiments of the invention may further include delivering coolant to additional cooling plates and/or passageways 176 that may, for example, provide conductive cooling to heat-sensitive circuitry, such as the driving circuitry boards 18 (position illustrated by dotted outline).

Figure 11:
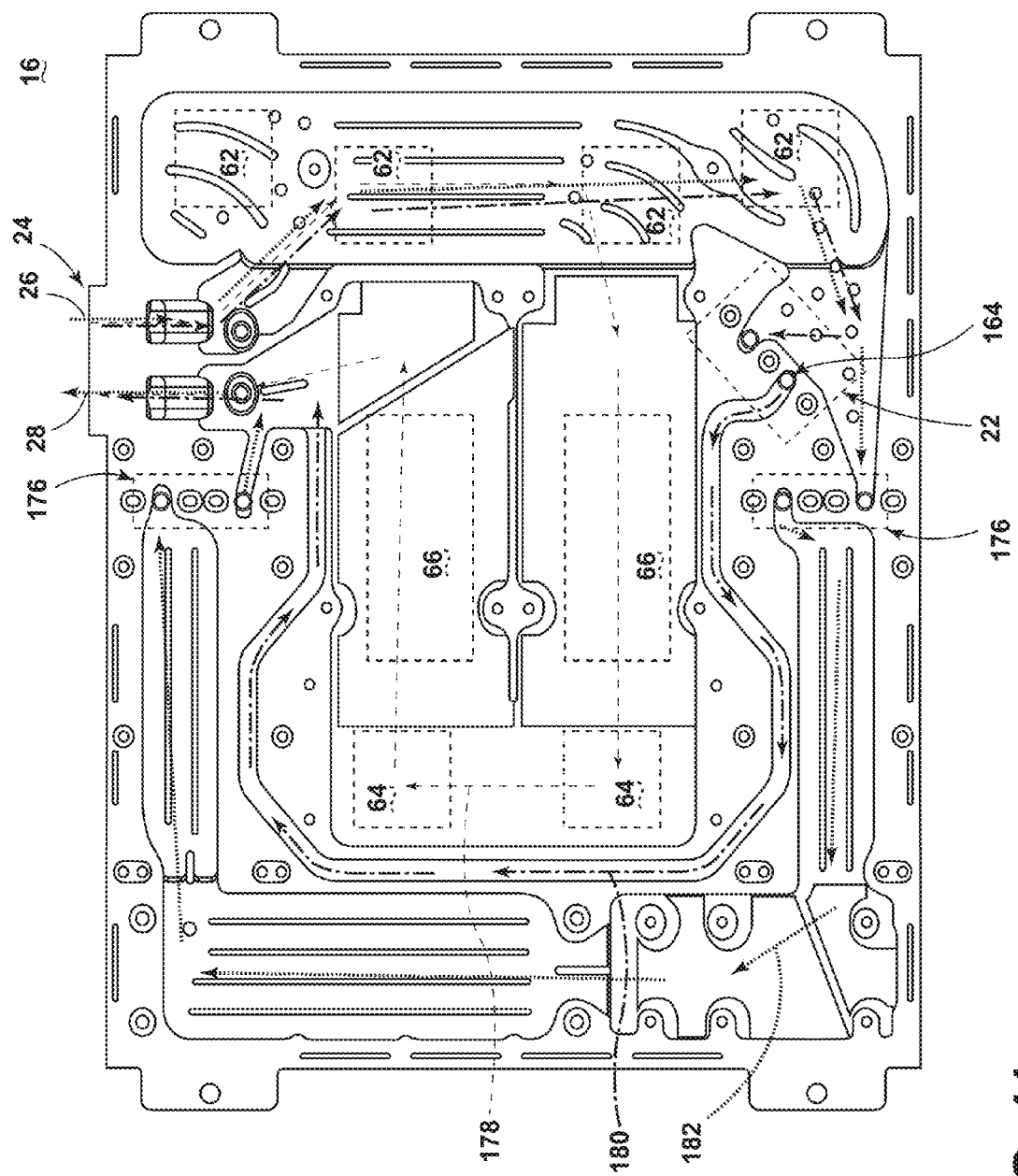
FIG. 11 is a top view of internal coolant passageways of the primary cold plate of the heat exchanger assembly of FIG. 9.

FIG. 11 illustrates one exemplary embodiment of the internal coolant passageways of the primary cold plate 16 illustrating at least a portion of different coolant flow paths, coolant circuits, and/or coolant loops. For example, a first coolant loop 178 may be defined by at least one passageway configured to deliver coolant proximate to one or more inductors 62, followed by a first power converter module 66, at least one transformer 64, and a second power converter module 66 before returning the coolant to the outlet port 26. A second coolant loop 180 may be defined by at least one passageway configured to deliver coolant proximate to one or more inductors 62 and followed by the heat exchanger 22 before returning the coolant to the outlet port 26. Additionally, a third coolant loop 182 may be defined by at least one passageway configured to deliver coolant proximate to one or more inductors 62 and followed by any additional cooling components 176 before returning the coolant to the outlet port 26. While three coolant loops 178, 180, 182 of the primary cold plate 16 are illustrated, any number of coolant loop variations may be formed and/or machined as part of the cold plate 16 to effect a cooling of one or more thermally conductive relationships with one or more heat-producing components including, but not limited to, power converter modules 66, inductors 62, transformers 64, and with one or more heat-sensitive circuitry components, for example, the driving circuitry boards 18. The coolant loops 178, 180, 182 described are configured to maintain and/or exceed one or more temperature and/or thermal management considerations, as defined herein.

Figure 12:
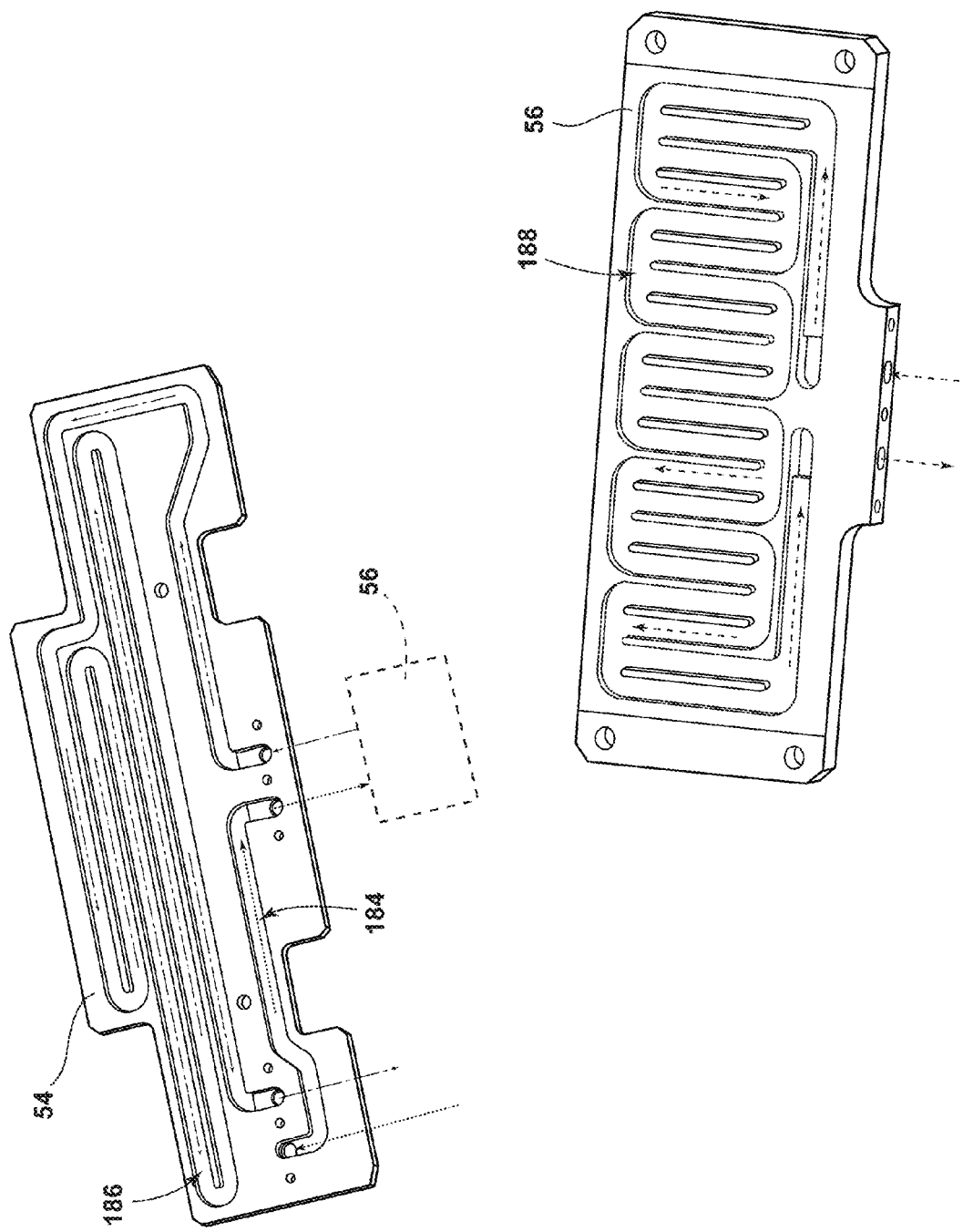
FIG. 12 is a top view of the internal coolant passageways of secondary and tertiary cold plates of the heat exchanger assembly of FIG. 9.

FIG. 12 illustrates exemplary embodiments of the internal coolant passageways of the secondary and tertiary cold plates 54, 56. As shown, the secondary cold plate 54 includes at least one coolant passage 184, such that coolant may be delivered to the secondary cold plate 54 to effect a conductive cooling of at least a portion of the secondary cold plate 54. Similarly, the tertiary cold plate 56 includes at least one coolant passage 188 such that coolant may be delivered to the tertiary cold plate 56 to effect a conductive cooling of at least a portion of the tertiary cold plate 56.

As illustrated the secondary cold plate 54 may include a first coolant passage 184 and a second coolant passage 186, wherein the first and second passages 184, 186 are interrupted by delivering coolant to the tertiary cold plate 56. In this configuration, coolant delivered to the secondary cold plate 54 may initially cool a first portion of the secondary cold plate 54 proximate to the first coolant passage 184, upstream from the serial fluid coupling with the tertiary cold plate 56, followed by cooling a different second portion of the secondary cold plate 54 proximate to the second coolant passage 186, downstream from the serial fluid coupling with the tertiary cold plate 56. Alternative coolant passage 184, 186, 188 may be included in embodiments of the invention.

The above-described embodiments provide for a power converter assembly 10 capable of high voltage and high current power conversion in a small, included structure. The above-described embodiments further provide for cooling the various heat-producing components of the power converter assembly 10 in accordance with heat management considerations. The cooling of the assembly 10 may be concerned with two particular "thermal zones" of the assembly: a first zone defined by the volume enclosed by the thermal composite 20 and the primary cold plate 16, and including heat-generating components such as the power converter modules 66, the inductors 62, the transformers 64, and heat-removing components including at least a portion of the primary cold plate 16, the secondary cold plate 54, the tertiary cold plate 56, and the first and second tubing sets 58, 60; and a second zone defined by the housing 12 and including all components not enclosed in the first zone, including heat-sensitive components such as the driving circuitry boards 18 and heat-removing components including at least another portion of the primary cold plate 16, the heat exchanger 22, and fan 172.

The heat exchanger assembly 148, in combination with the coolant reservoir 30 and coolant pump 34, operate to remove heat generated by the heat-producing components by removing heat via conduction with the cold plates 16, 54, 56 and via forced air convection of the ambient air with the heat exchanger 22 and fan 172. By removing the heat generated by the heat-producing components, the heat exchanger assembly 148 prevents the heat-sensitive circuitry from damage and/or thermal failure by preventing the temperature of the heat-sensitive circuitry from rising above the thermal limit value of the circuitry. In this sense, the heat exchanger assembly 148 operates to control the temperature of the one or more heat-producing components, heat-sensitive components, and ambient air within the housing 12.

For example, a heat-producing component, such as a power converter module 66 will generate a large amount of heat, as measured in thermal Watts, during the high current power conversion described herein. In one example configuration, each power module may generate at least 440 collective thermal Watts via at least conduction (e.g. into the circuit board 100) and convection (e.g. into the first zone included by the primary cold plate 16 and thermal composite 20). The heat generated by the power converter module 66 may be further transferred into the second zone through conduction and/or radiation of heat through the thermal composite 20, or through any access openings or imperfect seems of the composite 20. In this embodiment, the majority of heat generated by a power converter module may be removed via a conduction path defined from, for example, the diodes 108, through to circuit board 100, through the conductive substrate layer 140, through a thermal coupling with the primary cold plate 16, and into a coolant passage of the primary cold plate 16, wherein, for instance, coolant 32 traversing the first coolant loop 178 will absorb the heat and carry it away to a location external to the power converter assembly 10, such as the coolant reservoir 30. In this example, the heat exchanger assembly 148 may be configured to remove at least 300 thermal Watts of heat from each power converter module 66 via conduction. While 300 thermal Watts is described, alternate amounts of heat removal may be included.

In another example, a heat-producing component, such as an inductor 62 during power conversion operation of the assembly 10, which may be generated via at least conduction (e.g. into at least one of primary cold plate 16 or the secondary cold plate 54, each of which are conductively coupled with each inductor 62), and again, convection (e.g. into the first zone). Again, some heat may be further transferred into the second zone through conduction and/or radiation of heat through the thermal composite 20, or through any access openings or imperfect seems of the composite 20. In this embodiment, the majority of heat generated by the inductor 62 may be removed via another conduction path defined from, for example, at least one face of the inductor 62, through a corresponding component seat 150 of at least one of the primary or secondary cold plates 16, 54, wherein, for instance, coolant 32 traversing the first, second, and/or third coolant loops 178, 180, 182 will absorb the heat and carry it away to a location external to the power converter assembly 10, such as the coolant reservoir 30. In this example, the heat exchanger assembly 148 may be configured to remove at least 15 thermal Watts of heat from each inductor 62 via conduction (e.g. 7.5 thermal Watts of heat into each plate 16, 54). Embodiments of the invention may be configured to remove at least a portion of heat generated by the inductor 62 through each of the cold plates 16, 54, although the distribution of heat removal does not need to be equally shared between the plates 16, 54.

In another example, a heat-producing component, such as an transformer 64 during power conversion operation of the assembly 10, which may be generated via at least conduction (e.g. into at least one of primary cold plate 16 or the tertiary cold plate 56, each of which are conductively coupled with each transformer 64), and again, convection (e.g. into the first zone). Again, some heat may be further transferred into the second zone through conduction and/or radiation of heat through the thermal composite 20, or through any access openings or imperfect seems of the composite 20. In this embodiment, the majority of heat generated by the transformer 64 may be removed via another conduction path defined from, for example, at least one face of the transformer 64, through a corresponding component seat 150 of at least one of the primary or tertiary cold plates 16, 56, wherein, for instance, coolant 32 traversing the first coolant loop 178 will absorb the heat and carry it away to a location external to the power converter assembly 10, such as the coolant reservoir 30. In this example, the heat exchanger assembly 148 may be configured to remove at least 100 thermal Watts of heat from each transformer 64 via conduction (e.g. 50 thermal Watts of heat into each plate 16, 56). Embodiments of the invention may be configured to remove at least a portion of heat generated by the transformer 64 through each of the cold plates 16, 56, although the distribution of heat removal does not need to be equally shared between the plates 16, 56.

Any heat that enters the second zone may also be removed from the power converter assembly 10 by way of conduction into the housing 12, and radiation of that heat to the external environment, for example, via the pin fins, or it may be removed by way of forced convection by the movement of ambient air of the second zone through the heat exchanger 22. In this embodiment, the plurality of fins 162 of the heat exchanger 22 remove heat by way of forced convection when the fan effects a movement of the warm or hot ambient air past the fins 162, which are thermally coupled with the coolant passage 160 of the heat exchanger 22. The heat from the ambient air is transferred into the coolant passage, wherein, for instance, coolant 32 traversing the second coolant loop 180 will absorb the heat and carry it away to a location external to the power converter assembly 10, such as the coolant reservoir 30. In this example, the heat exchanger 22 may be configured to remove at least 70 thermal Watts of heat from the ambient air of the second zone by forced convection. In addition to cooling the ambient air by forced convection, the shaped fins 174 of the heat exchanger 22 may further direct the cooled air exiting the exchanger 22 toward, for example, at least one of a heat-producing component, one or more access openings 38, or a heat-sensitive circuitry such as the driving circuit boards 18 to further distribute and/or manage the thermal concerns of the power converter assembly 10, as needed.

The combined efforts of the heat exchanger assembly 148 may operate to keep all components of the power converter assembly 10, the first zone, the second zone, or the cavity 14 of the housing 12, at or below a maximum thermal limit value that, when exceeded, may cause thermal damage or failure to one or more components, such as the heat-sensitive circuitry. In one example, power converter assembly 10 may remain at or below 85 degrees Celsius during continual operation, when supplied with, for example, coolant at 71 degrees Celsius and ambient air (internal or external to the housing 12) at 71 degree Celsius. Embodiments of the invention may include an expected operating temperature range for the power converter assembly 10, such as between 85 and 105 degrees Celsius, wherein the thermal limit value may include a time component (e.g. thermal limit value is above 90 degrees Celsius for more than 3 minutes, etc.).

Additionally, embodiments of the invention may include different thermal limit values for different components. For example, it is known that power magnetics devices, such as inductors 62 and transformers 64 lose efficiency as thermal loses build during operation. At a high enough temperature, known as the Curie temperature, a power magnetics device may lose the material's permanent magnetism, drastically reducing operating efficiency. In this embodiment, the heat exchanger assembly 148 may be configured to remove heat from the assembly 10 such that the temperature of one or more power magnetics device is maintained at, below, or within a predetermined amount of the Curie temperature of the device. For example, the heat exchanger assembly 148 may be configured to keep a transformer 64 operating at a rate of at least an 50% efficiency, or at least below 70% of the transformer's Curie temperature Many other possible embodiments and configurations in addition to that shown in the above figures are contemplated by the present disclosure. For example, one embodiment of the invention contemplates accounting for additional heat-producing components such as filter cans, switching devices, and bus bars variously located within at least one of the first and/or second zones. Additionally, the design and placement of the various components may be rearranged such that a number of different in-line configurations could be realized.

The embodiments disclosed herein provide a power converter assembly capable of converting large amounts of power, yet may be included in a relatively small volume. One advantage that may be realized in the above embodiments is that the thermal composite of the above described embodiments may act as a thermal and electrical shield preventing high temperatures generated in the first zone from easily escaping into the second zone, which may have heat-sensitive circuitry. The thermal composite additionally forces a higher thermal environment to be maintained in the first zone, which forces more generated heat to be absorbed by the coolant-cooled portions of the assembly, which are generally more effective at removing heat. Furthermore, the thermal composite includes a high thermal gradient from the bottom surface to the top surface, and thus drastically reduces and/or minimizes any thermal radiated emissions from the first zone. This may lead to a reduction in costs associated with the assembly by using lower temperature components in the second zone of the assembly, or in reducing development costs of high temperature devices that do not currently exist or do not operate in such high temperature environments. Another advantage of the above-described embodiments is that electrical components in the second zone may have an improved component reliability and lifespan due to lower operating temperature.

Another advantage of the above-described embodiments is that the heat exchanger assembly provides a high level of heat removal from the heat-producing components to prevent the components from experiencing thermally-related efficiency losses, thermal runaway, and/or catastrophic thermal failure. The high level of heat removal further provide for an assembly embodiment to be included in a relatively small volume, and thus, increases the portability and/or availability of the assembly to be installed in environments where space is a concern.

Yet another advantage of the above-described embodiments is that the heat exchanger assembly effectively cools the power magnetics devices, which may dramatically lower the thermal resistance of such ferrite materials, as well as prevent saturation of the devices due to exceeding the Curie temperature rating for each respective device.

Even yet another advantage of the above-described embodiments is that the power converter module is capable of removing large amounts of heat via the conductive substrate, allowing the diodes to operate at a higher power level without thermal effects and/or failure. Additionally the use of SiC diodes without chip packaging allows for higher power level operation with fewer parasitics, transients, and voltage spikes at a reduced circuit board surface area. Furthermore, the design allows for a plurality of configurations including AC to DC power conversion, DC to DC power conversion, half-wave rectification and/or full-wave rectification, at power levels high enough to provide for, for example, a 15 KW power output. The combination of increased cooling mechanisms and smaller power converter modules may aid in collectively reducing the volume of the power converter assembly by 60%, and reduce the weight of the assembly by 50%, when compared to preexisting units that only operated at 8 KW power output.

To the extent not already described, the different features and structures of the various embodiments may be used in combination with each other as desired. That one feature may not be illustrated in all of the embodiments is not meant to be construed that it may not be, but is done for brevity of description. Thus, the various features of the different embodiments may be mixed and matched as desired to form new embodiments, whether or not the new embodiments are expressly described. All combinations or permutations of features described herein are covered by this disclosure.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A power converter assembly, comprising:
   a housing;
   a cold plate located within the housing;
   a power converter module conductively coupled with the cold plate, receiving a power input, and providing a power output, wherein the housing is enclosed such that a thermal output of the power converter module is greater than the rate of thermal transfer out of the housing by natural heat transfer;
   heat-sensitive circuitry located within the housing and having a predetermined thermal operating limit; and
   a thermal composite overlying the power converter module and at least partially thermally insulating the power converter module from the heat sensitive circuitry;
   wherein the power converter module generates heat while converting the power input to the power output, the thermal composite insulates the heat-sensitive circuitry from at least a portion of the generated heat such that the temperature of the heat-sensitive circuitry does not rise above the thermal operating limit, and at least a portion of the generated heat is removed by way of conduction through the cold plate.

2. The power converter assembly of claim 1 wherein the cold plate defines at least a portion of the housing.

3. The power converter assembly of claim 1 wherein the cold plate further comprises a first coolant passage fluidly coupled with a coolant reservoir.

4. The power converter assembly of claim 3 wherein the coolant reservoir is external to the housing.

5. The power converter assembly of claim 3 further comprising a heat exchanger supported by the cold plate and comprising:
   a second coolant passage fluidly coupled with the first coolant passage; and
   a plurality of thermally conductive fins conductively coupled with the second coolant passage.

6. The power converter assembly of claim 5 wherein the heat exchanger further comprises a fan configured to move ambient air past the plurality of thermally conductive fins wherein the movement of the air past the fins cools the air by forced convection, and wherein at least a portion of heat generated by the power converter module is removed by way of the forced convection.

7. The heat exchanger assembly of claim 5 wherein a least a portion of at least one fin is physically oriented to direct air toward at least one of the power converter module or the heat-sensitive circuitry.

8. The power converter assembly of claim 1 wherein the power converter module provides at least a 10 KW power output at 500 Ampere loads.

9. The power converter assembly of claim 8 wherein the housing is contained in a volume of at most 12 inches by 12 inches by 6 inches.

10. The power converter assembly of claim 1 wherein the input voltage is at least one of AC or DC and the output voltage is DC.

11. The power converter assembly of claim 1 wherein the thermal limit is 85 degrees Celsius.

12. The power converter assembly of claim 1 wherein the thermal composite further comprises an electrically insulating layer.

13. The power converter assembly of claim 1 wherein the power converter module further comprises at least one silicon carbide diode.

* * * * *